Figure 1:
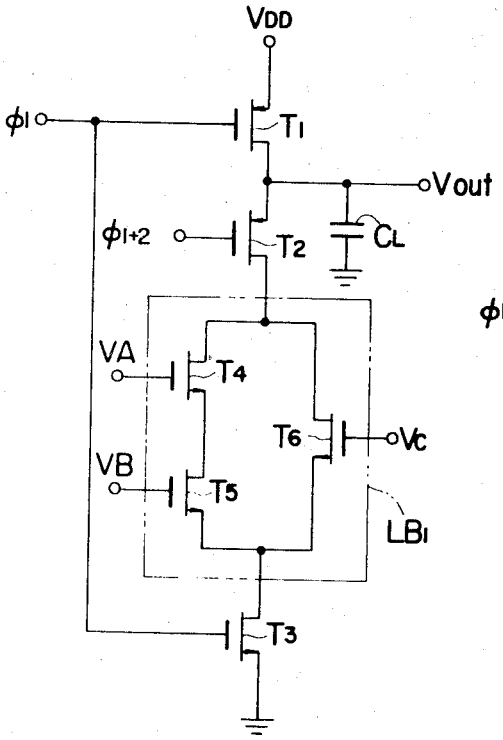
Figure 2:
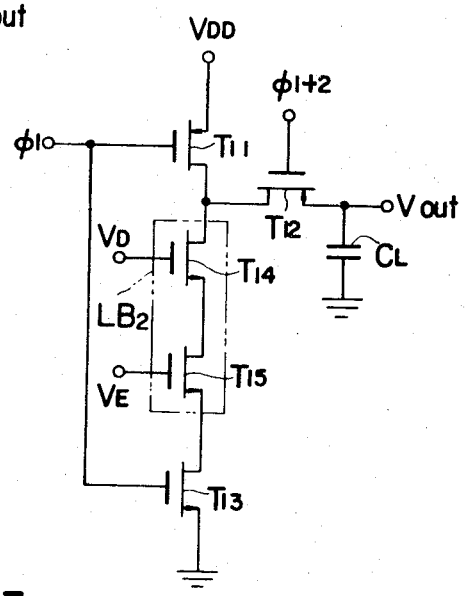
Figure 3:
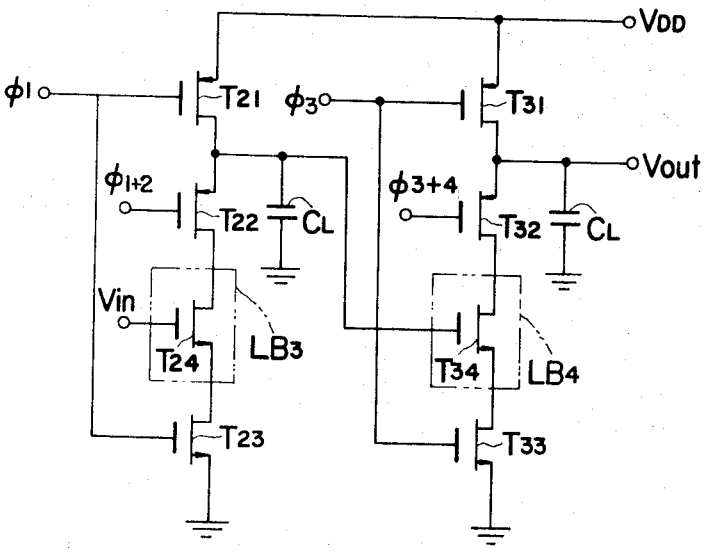
Figure 4:
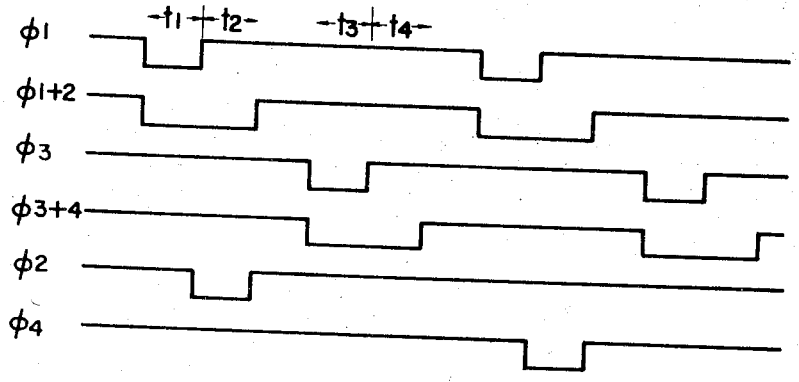
Figure 5A:
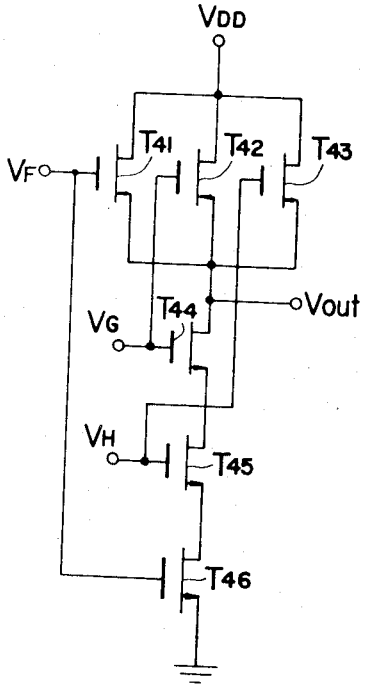
Figure 5B:
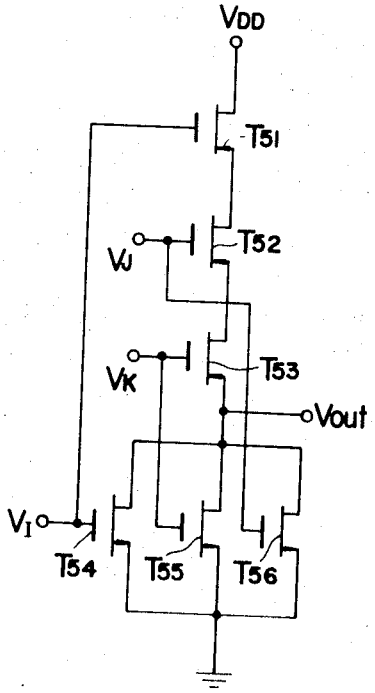

DEFENSIVE PUBLICATION

UNITED STATES PATENT OFFICE

Published at the request of the applicant or owner in accordance with the Notice of Dec. 16, 1969, 869 O.G. 687. The abstracts of Defensive Publication applications are identified by distinctly numbered series and are arranged chronologically. The heading of each abstract indicates the number of pages of specification, including claims and sheets of drawings contained in the application as originally filed. The files of these applications are available to the public for inspection and reproduction may be purchased for 30 cents a sheet.

Defensive Publication applications have not been examined as to the merits of alleged invention. The Patent Office makes no assertion as to the novelty of the disclosed subject matter.

PUBLISHED SEPTEMBER 3, 1974

926 O.G. 9

T926,003

POLYPHASE LOGICAL CIRCUIT EMPLOYING COMPLEMENTARY MISFET'S

Kosei Nomiya, 2–47–16 Eifuku, Suginami-ku; Yoshikazu Hatsukano, 1211 Gakuennishi-machi, Kodaira-shi; and Suichi Torii, 1503 Josuihon-cho, Kodaira-shi, all of Tokyo, Japan

Filed July 23, 1973, Ser. No. 381,484
Claims priority, application Japan, Aug. 25, 1972, 47/84,574
Int. Cl. H03k *19/08, 19/20;* G11c *19/00*
U.S. Cl. 307—205
2 Sheets Drawing. 10 Pages Specification

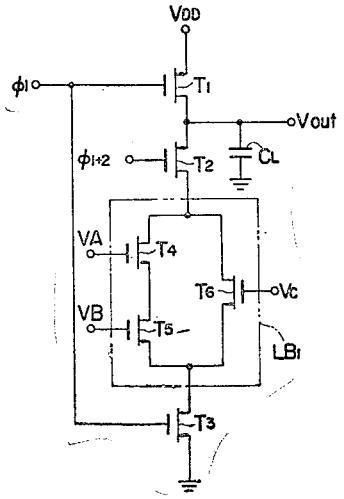

A complementary MOS logic circuit has a reduced number of transistors. A P-channel MOSFET and an N-channel MOSFET are connected in series with a logical block of a predetermined logical expression between one terminal of a power source and the logical block and between the logical block and the other terminal of the power source, respectively. Means is provided which drives the P-channel and N-channel MOSFETs by a first clock pulse. Means is provided which establishes a current path between the logical block and an output terminal of the complementary MOS logical circuit or between the connection point of the logical block and P-channel MOSFET and the output terminal at timings of the first clock pulse and a second clock pulse differing in phase therefrom.

POLYPHASE LOGICAL CIRCUIT EMPLOYING COMPLEMENTARY MISFET'S

Filed July 23, 1973